(12) United States Patent
Michel

(10) Patent No.: US 9,076,921 B2
(45) Date of Patent: Jul. 7, 2015

(54) DARK CURRENT REDUCTION FOR LARGE AREA PHOTODIODES

(75) Inventor: Jurgen Michel, Arlington, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 497 days.

(21) Appl. No.: 12/505,712

(22) Filed: Jul. 20, 2009

(65) Prior Publication Data

US 2010/0012973 A1    Jan. 21, 2010

Related U.S. Application Data

(60) Provisional application No. 61/081,766, filed on Jul. 18, 2008.

(51) Int. Cl.
| | |
|---|---|
| *H01L 27/14* | (2006.01) |
| *H01L 21/20* | (2006.01) |
| *H01L 31/0232* | (2014.01) |
| *H01L 31/18* | (2006.01) |
| *H01L 27/146* | (2006.01) |
| *H01L 31/103* | (2006.01) |
| *H01L 31/109* | (2006.01) |

(52) U.S. Cl.
CPC ........ *H01L 31/1828* (2013.01); *H01L 27/1463* (2013.01); *H01L 27/14643* (2013.01); *H01L 31/1032* (2013.01); *H01L 31/1035* (2013.01); *H01L 31/109* (2013.01); *H01L 31/184* (2013.01); *Y02E 10/543* (2013.01); *Y02E 10/544* (2013.01)

(58) Field of Classification Search
CPC ............ H01L 27/1463; H01L 27/14643; H01L 31/105

USPC ......... 257/185, 186, 188, 189, 233, E27.133, 257/E31.058, 184, 292; 438/74–75, 66, 73

See application file for complete search history.

(56) References Cited

U.S. PATENT DOCUMENTS

| | | | |
|---|---|---|---|
| 5,158,907 A | 10/1992 | Fitzgerald, Jr. | |
| 5,945,690 A * | 8/1999 | Saito et al. | ...................... 257/94 |

(Continued)

FOREIGN PATENT DOCUMENTS

| | | |
|---|---|---|
| JP | 1997-213917 | 8/1997 |
| KR | 10-2004-0011066 | 2/2004 |

OTHER PUBLICATIONS

Fitzgerald et al., "Nucleation mechanisms and the elimination of misfit dislocations at mismatched interfaces by reduction in growth area" J. Appl. Phys. 65, Mar. 15, 1999, pp. 2220-2237.
Peterson et al., "High-Quality Large-Area MBE HgCdTe/Si" Journal of Electronic Materials, vol. 35, No. 6, 2006, pp. 1283-1286.

(Continued)

*Primary Examiner* — Marvin Payen
*Assistant Examiner* — Jeremy Joy
(74) *Attorney, Agent, or Firm* — Gesmer Updegrove LLP

(57) ABSTRACT

A method of fabricating a large area photodiode is provided. The method includes providing a substrate having a first contact layer formed thereon. Also, the method includes forming a dielectric layer on the first contact layer and patterning selective areas of the dielectric layer to form a plurality of dielectric windows. Each of the dielectric windows has an open region exposing the first contact layer. Furthermore, the method includes epitaxially growing photodiode material(s) in the dielectric windows, wherein each of the dielectric windows are individualized photodiode structures.

14 Claims, 3 Drawing Sheets

(56) References Cited

U.S. PATENT DOCUMENTS

| | | | |
|---|---|---|---|
| 7,592,654 B2* | 9/2009 | Bahl et al. | 257/291 |
| 2002/0185702 A1* | 12/2002 | Shirai et al. | 257/443 |
| 2004/0135066 A1* | 7/2004 | Lim | 250/208.1 |
| 2005/0139832 A1* | 6/2005 | Jeon | 257/69 |
| 2005/0263840 A1 | 12/2005 | Maeng et al. | |
| 2007/0264835 A1* | 11/2007 | Iguchi et al. | 438/717 |
| 2008/0090321 A1* | 4/2008 | Fujita | 438/57 |

OTHER PUBLICATIONS

Johnson et al., "HgCdTe/Si Materials for Long Wavelength Infrared Detectors" Journal of Electronic Materials, vol. 35, No. 6, 2004, pp. 526-530.

Johnson et al., "Direct Growth of Cd/ZnTe/Si Substrates for Large-Area HgCdTe Infrared Focal Plane Arrays" Journal of Electronic Materials, vol. 24, No. 5, 1995, pp. 467-473.

* cited by examiner

DARK CURRENT REDUCTION FOR LARGE AREA PHOTODIODES

PRIORITY INFORMATION

This application claims priority from provisional application Ser. No. 61/081,766 filed Jul. 18, 2008, which is incorporated herein by reference in its entirety.

BACKGROUND OF THE INVENTION

The invention is related to the field of photodiodes, and in particular to dark current reduction for large area photodiodes.

Large area, high performance photodiodes are critical for advances in information technology (polymer optical fiber (POF) networks, multimode optical fibers), for advanced photovoltaic applications and for imaging applications. Because of low cost requirements, high performance semiconductor materials are increasingly deposited on low cost substrates like silicon.

The epitaxial growth of lattice mismatched semiconductor materials for devices generally results in misfit and threading dislocations as well as point defects in the epitaxial grown semiconductor material. The high defect density leads to poor device performance, generally resulting in a large dark current of the device. An example is epitaxial germanium (Ge) on silicon (Si). The lattice mismatch between Si and Ge is 4.2% and Ge devices like photodiodes show large dark current for large area devices (>50 µm diameter). Similarly, large dark current due to lattice mismatch has for example limited device performance for CdZnTe on Si or HgCdTe on Si. Similar results can also be observed for SiGe alloys and III-V semiconductor materials, epitaxially grown on Si.

Several methods have been developed in the past to alleviate the dark current problem. For small size devices, etched mesas combined with high temperature annealing helped reduce threading dislocation densities and point defects, resulting in smaller dark currents. Another approach was the introduction of graded buffer layers, epitaxial layers of materials with smaller lattice mismatch, that reduce the threading dislocation density. While this method can reduce dark current significantly, the several micron thick buffer layer is in many cases undesirable.

Recently it has been shown that micron sized Ge detectors, grown selectively in windows of a dielectric material like silicon oxide or silicon nitride on Si have very low dark currents. Two effects lead to the small dark current. First, the small size allows threading dislocation reduction very similar to the mesa approach described before. Secondly, the growth in the dielectric window improves the sidewall passivation of the detector significantly.

Large detectors of lattice mismatched materials can utilize these effects to reduce dark currents by dividing the large area into smaller sections that are separated by a dielectric material, thereby reducing misfit dislocations due to the mesa effect and improving side wall passivation due to the growth in the dielectric window.

SUMMARY OF THE INVENTION

According to one aspect of the invention, there is provided a method of fabricating a large area photodiode. The method includes providing a substrate where a first contact layer is formed on the substrate. Also, the method includes forming a dielectric layer on the first contact layer and patterning selective areas of the dielectric layer to form a plurality of dielectric windows. Each of the dielectric windows has an open region exposing the first contact layer. Furthermore, the method includes epitaxially growing photodiode material(s) in the dielectric windows, wherein each of the dielectric windows are individualized photodiode structures.

According to another aspect of the invention, there is provided a large area photodiode. The large area photodiode includes a substrate where a first contact layer is formed on the substrate. A dielectric layer is formed on the first contact layer. A plurality of dielectric windows is formed on selective areas of the dielectric layer. Each of the dielectric windows includes an open region exposing the first contact layer and filled with epitaxially grown photodiode material(s), wherein each of the dielectric windows are individualized photodiode structures.

DETAILED DESCRIPTION OF THE INVENTION

The invention provides a novel technique for fabrication of photodiode structures by dividing a single large area photodiode device into smaller segments of photodiode elements that are separated by thin dielectric "walls".

Figure 1:
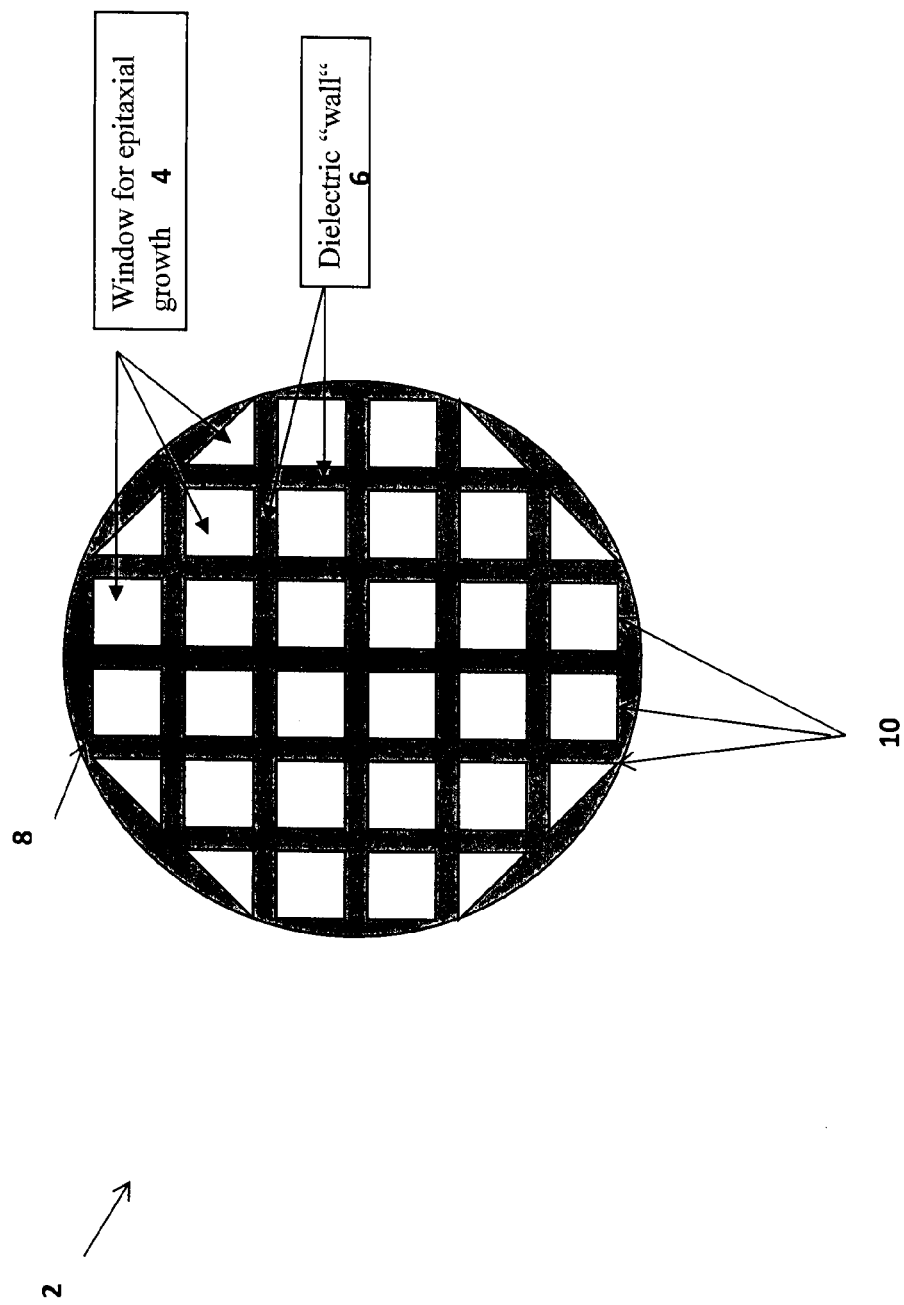
FIG. 1 is a schematic diagram illustrating the novel large area photodiode structure.

FIG. 1 shows the top view of a novel large photodiode structure 2 in accordance with an exemplary embodiment of the invention. The large photodiode structure 2 includes a plurality of specifically designed dielectric windows 10 etched on a dielectric layer 8. Each of these dielectric windows 10 includes epitaxially grown mismatched photodiode material(s) 4 and acts as a single photodiode element. Also, the dielectric windows 10 are separated by dielectric walls 6 associated with the dielectric layer 8 to provide isolation from adjacent dielectric windows.

This arrangement can reduce the dark current density of the large photodiode structure 2 significantly. The size of the dielectric windows 10 can be chosen so that the performance metric can be optimized. There is a trade-off between window size (determines dark current) and device efficiency since the dielectric walls 6 do not contribute to the device performance and, in the case of photodiodes, light that illuminates the dielectric walls 6 will not contribute to the photocurrent. In the same way, the thickness of the dielectric walls 6 can influence the device efficiency. Thicker walls will result in lower device efficiency.

Figure 2:
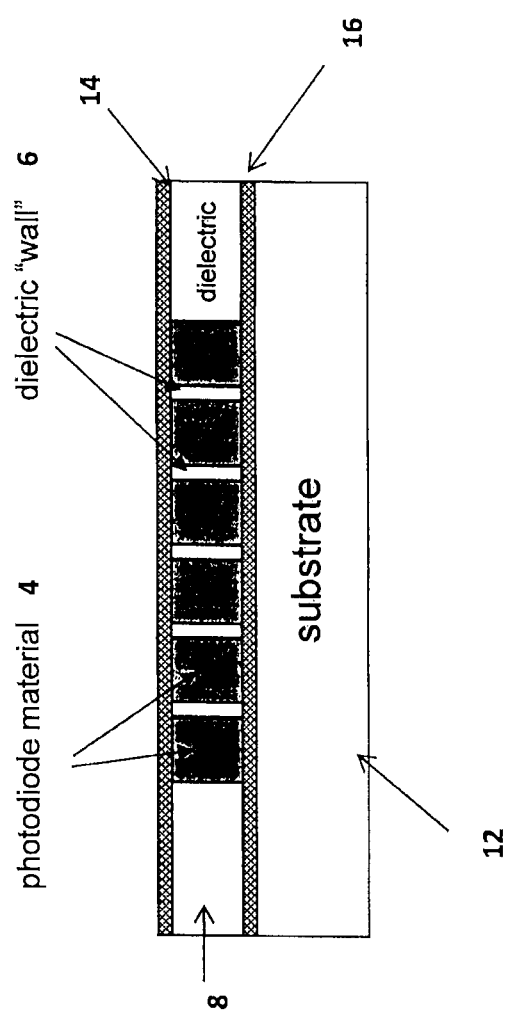
FIG. 2 is a schematic diagram illustrating the cross sectional view of the large area photodiode illustrated in FIG. 1.

FIG. 2 shows the cross section view of the of the large photodiode structure 2. This view shows that the large photodiode structure 2 includes a substrate 12 and a bottom contact layer 16 is grown on the substrate. The dielectric layer 8 is grown or deposited on a bottom contact layer 16. Selective areas of the dielectric layer 8 are patterned to form dielectric windows 10 exposing the substrate 12. Mismatched photodiode material(s) are grown in the dielectric windows 10. Dielectric walls 6 provide separation between the dielectric windows 10 so as to provide proper isolation. The thickness of the dielectric walls 6 are based on the efficiency needed. A top contact 14 can be positioned on the top region of the large photodiode structure, however, this is optional.

Figure 3:
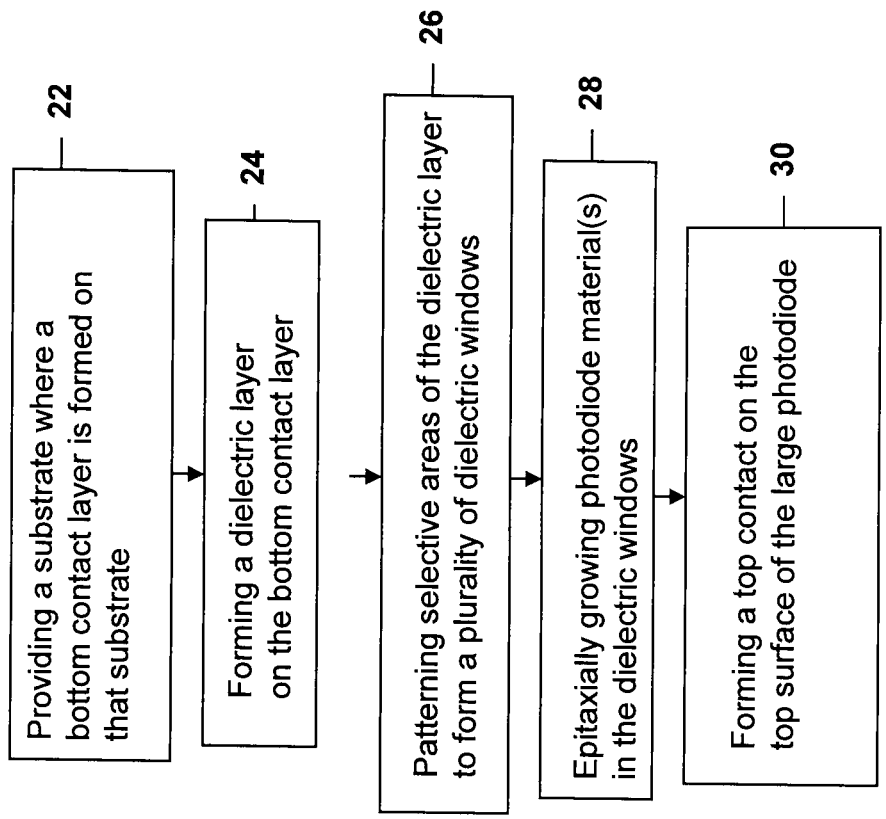
FIG. 3 is a flowchart illustrating the steps used for fabricating the novel large area photodiode.

FIG. 3 is a flowchart demonstrating the fabrication steps used in forming the large area photodiode 2. A substrate is provided where a bottom contact layer is formed on that substrate, as shown in step 22. The substrate includes a crystalline structure that can have II-VI, III-V, or group IV semiconductor materials. The bottom contact layer covers the entire surface of the substrate, and can include materials such as any doped semiconductor material or metal. The doped semiconductor can have a doping concentration of $10^{18}$ or higher. A dielectric layer is formed on the bottom contact layer, as shown in step 24. The dielectric layer covers the entire surface of the bottom contact layer. Selective areas of the dielectric layer are patterned to form a plurality of dielectric windows, as shown in step 26. The dielectric windows are comparable to an opening that exposes the surface of the bottom contact layer. Any conventional known techniques in patterning dielectric layers can be used, such as dry etching. The dielectric windows can be patterned into any shape, however, the shape must be in conformance so as to not be a deterrent in the proper operation of the large area photodiode. The dielectric layer can include semiconductor materials such as silicon dioxide $SiO_2$, $Si_3N_4$, SiON, or any dielectric material that allows growth in the dielectric windows can be used. Each of the dielectric windows is separated by an isolation distance from adjacent dielectric windows by the thickness of the dielectric walls. Photodiode material(s) are epitaxially grown in the dielectric windows, as show in step 28. The photodiode material(s) can includes group IV, II-V, and II-VI semiconductor materials but must have a different lattice constant then the substrate. Each of the filled dielectric windows operates as single individualized photodiodes. These fabrication steps form the inventive large area photodiode 2.

A top contact can be grown on the top surface of the large photodiode 2 as shown in step 30, but it is optional. The top contact includes materials similar to that described for the bottom contact layer.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a large area photodiode comprising:
   providing a substrate where a first contact layer is formed on the substrate;
   forming a dielectric layer on the first contact layer;
   patterning selective areas of the dielectric layer to form a plurality of dielectric windows, each of said dielectric windows comprising an open region exposing the first contact layer, wherein the size of each of said dielectric windows determines dark current of said photodiode;
      positioning a plurality of dielectric walls between adjacent dielectric windows, the dielectric walls provide complete separation between the dielectric windows so as to provide complete isolation from adjacent dielectric windows, wherein operational device efficiency of said large area photodiode is based on thickness of said dielectric walls;
   epitaxially growing mismatched photodiode material so as to completely fill each of the dielectric windows, wherein each of said dielectric windows are individualized photodiode structures; and
   forming a top contact layer that is uniformly distributed on a top surface of said photodiode material.

2. The method of claim 1, wherein said substrate comprises a crystal having II-VI, III-V, or group IV semiconductor materials.

3. The method of claim 1, wherein said dielectric layer comprises $SiO_2$, $Si_3N_4$, or SiON.

4. The method of claim 1, wherein said first contact layer comprises a doped semiconductor.

5. The method of claim 4, wherein said doped semiconductor comprise a dopant concentration of $10^{18}$ or higher.

6. The method of claim 1, wherein said photodiode material(s) comprises group IV, III-V, or II-VI semiconductor materials.

7. The method of claim 1, wherein said photodiode material(s) comprises a different lattice constant then said substrate.

8. A large area photodiode comprising:
   a substrate having a first contact layer formed thereon;
   a dielectric layer formed on the first contact layer;
   a plurality of dielectric windows formed on selective areas of the dielectric layer, each of said dielectric windows comprising an open region exposing the first contact layer and filled with epitaxially grown mismatched photodiode material, wherein the size of each of said dielectric windows determines dark current of said photodiode, said dielectric windows are positioned between a plurality of dielectric walls, wherein each of said dielectric windows are individualized photodiode structures, the dielectric walls provide complete separation between the dielectric windows so as to provide complete isolation from adjacent dielectric windows, wherein operational device efficiency of said large area photodiode is based on thickness of said dielectric walls, and
   a top contact layer that is uniformly distributed on a top surface of said photodiode material.

9. The large area photodiode of claim 8, wherein said substrate comprises a crystal having II-VI, III-V, or group IV semiconductor materials.

10. The large area photodiode of claim 8, wherein said dielectric layer comprises $SiO_2$, $Si_3N_4$, or SiON.

11. The large area photodiode of claim 8, wherein said first contact layer comprises a doped semiconductor.

12. The large area photodiode of claim 11, wherein said doped semiconductor comprise a dopant concentration of $10^{18}$ or higher.

13. The large area photodiode of claim 8, wherein said photodiode material comprises group IV, III-V, or II-VI semiconductor materials.

14. The large area photodiode of claim 8, wherein said photodiode material comprises a different lattice constant then said substrate.

* * * * *